(12) United States Patent
Sachid

(10) Patent No.: US 11,715,780 B2
(45) Date of Patent: Aug. 1, 2023

(54) HIGH PERFORMANCE AND LOW POWER SEMICONDUCTOR DEVICE

(71) Applicant: Applied Materials, Inc., Santa Clara, CA (US)

(72) Inventor: Angada B. Sachid, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/074,348

(22) Filed: Oct. 19, 2020

(65) Prior Publication Data

US 2022/0123125 A1  Apr. 21, 2022

(51) Int. Cl.
| | |
|---|---|
| *H01L 29/49* | (2006.01) |
| *H01L 29/78* | (2006.01) |
| *H01L 29/51* | (2006.01) |
| *H01L 29/66* | (2006.01) |
| *H01L 21/28* | (2006.01) |
| *H01L 21/764* | (2006.01) |

(52) U.S. Cl.
CPC .... *H01L 29/4991* (2013.01); *H01L 21/28088* (2013.01); *H01L 21/28123* (2013.01); *H01L 21/764* (2013.01); *H01L 29/4966* (2013.01); *H01L 29/516* (2013.01); *H01L 29/6653* (2013.01); *H01L 29/6656* (2013.01); *H01L 29/6684* (2013.01); *H01L 29/66545* (2013.01); *H01L 29/78391* (2014.09)

(58) Field of Classification Search
CPC ............. H01L 21/764; H01L 21/28088; H01L 21/28123; H01L 29/4991; H01L 29/4966; H01L 29/516; H01L 29/66545; H01L 29/6684; H01L 29/78391; H01L 29/6656; H01L 29/6653; H01L 29/0649–0653; H01L 29/515
See application file for complete search history.

(56) References Cited

U.S. PATENT DOCUMENTS

| | | | | |
|---|---|---|---|---|
| 5,914,519 A | * | 6/1999 | Chou | .................. H01L 29/6659 257/408 |
| 2017/0194423 A1 | * | 7/2017 | Lin | ....................... H01L 21/764 |
| 2018/0097059 A1 | * | 4/2018 | Bi | ......................... H01L 29/401 |
| 2020/0098886 A1 | * | 3/2020 | Liu | ........................ H01L 21/311 |
| 2020/0219989 A1 | * | 7/2020 | Cheng | .................. H01L 29/515 |

* cited by examiner

*Primary Examiner* — Jose R Diaz
(74) *Attorney, Agent, or Firm* — Kilpatrick Townsend & Stockton LLP

(57) ABSTRACT

Processing methods may be performed to form an airgap in a semiconductor structure. The methods may include forming a high-k material on a floor of a trench. The trench may be defined on a semiconductor substrate between sidewalls of a first material and a spacer material. The methods may include forming a gate structure on the high-k material. The gate structure may contact the first material along each sidewall of the trench. The methods may also include etching the first material. The etching may form an airgap adjacent the gate structure.

19 Claims, 12 Drawing Sheets

HIGH PERFORMANCE AND LOW POWER SEMICONDUCTOR DEVICE

TECHNICAL FIELD

The present technology relates to semiconductor systems, processes, and equipment. More specifically, the present technology relates to systems and methods for forming and etching material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, selectivity may play a larger role when only a few nanometers of material are formed in a particular layer, especially when the material is critical in the transistor formation. Moreover, as the number of exposed materials increases at any given time during fabrication, it is becoming more difficult to maintain sufficient selectivity to all other exposed materials. Many different etch process selectivities have been developed between various materials, although standard selectivities may no longer be suitable at current and future device scale.

Thus, there is a need for improved systems and methods that can be used to produce high quality devices and structures. These and other needs are addressed by the present technology.

SUMMARY

Processing methods may be performed to form an airgap in a semiconductor structure. The methods may include forming a high-k material on a floor of a trench. The trench may be defined on a semiconductor substrate between sidewalls of a first material and a spacer material. The methods may include forming a gate structure on the high-k material. The gate structure may contact the first material along each sidewall of the trench. The methods may also include etching the first material. The etching may form an airgap adjacent the gate structure.

In some embodiments, the first material may define a ledge on which the spacer material is formed laterally outward from the gate structure. The high-k material may be separated from the spacer material by the airgap. The sidewalls of the trench may be maintained substantially free of the high-k material while forming the high-k material. The first material may be or include graphene. The methods may also include depositing polysilicon on the semiconductor substrate, the polysilicon having a defined width equivalent to a width of the trench. The methods may also include depositing the first material overlying the polysilicon and the semiconductor substrate. The methods may also include depositing the spacer material overlying the first material. The methods may also include etching the first material and the spacer material to reveal the polysilicon and define the sidewalls. The methods may also include forming the trench at least in part by removing the polysilicon. The methods may also include depositing a protective material on the polysilicon before depositing the first material.

The present technology also encompasses semiconductor structures including a trench defined on a silicon substrate between sidewalls that may be or include a spacer material. The structures may include a dielectric material disposed on the silicon substrate. The structures may also include a gate structure disposed on the dielectric material. The dielectric material and the gate structure each may be separated from the spacer material by an airgap.

In some embodiments, the dielectric material may be maintained between lateral edges of the gate structure. The airgap may extend between the spacer material and the silicon substrate. The dielectric material may be or include a high-k material or a ferroelectric oxide material. The semiconductor structures may also include a source/drain material. A portion of the airgap may extend from the source/drain material to the dielectric material. The semiconductor structures may also include an interfacial layer between the silicon substrate and the dielectric material, and the interfacial layer may be or include silicon oxide.

The present technology may also encompass methods of forming a semiconductor structure. The methods may include depositing a dielectric material on a floor of a trench, wherein the trench is defined on a silicon substrate between sidewalls of a first material and a spacer material. The methods may also include forming a gate structure on the dielectric material, between the sidewalls. The gate structure may be in contact with the first material at the sidewalls of the trench.

In some embodiments, the first material may define a ledge on which the spacer material is formed laterally outward from the gate structure. The first material may extend vertically along exterior edges of the dielectric material and the gate structure. The sidewalls of the trench may be maintained substantially free of the dielectric material while forming the dielectric material. The first material may be or include hexagonal boron nitride. The gate structure may include a work-function material and a fill metal. Forming the gate structure may include depositing the work-function material adjacent the sidewalls and overlying the dielectric material. Forming the gate structure may also include depositing the fill metal on the work-function material. Forming the gate structure may also include removing the fill metal, the work-function material, and a portion of the dielectric material to reveal the spacer material. The dielectric material may be or include a high-k material or a ferroelectric oxide material.

Such technology may provide numerous benefits over conventional systems and techniques. For example, parasitic capacitance in the semiconductor structure may be reduced by forming an airgap between a gate structure and a spacer material. Additionally, because a material between the gate structure and the spacer material may have a low dielectric constant, relative to a high-k material disposed between the gate structure and the substrate, selective deposition of the high-k material on the floor of the trench may also provide a reduction of parasitic capacitance. These and other embodiments, along with many of their advantages and features, are described in more detail in conjunction with the below description and attached figures.

BRIEF DESCRIPTION OF THE DRAWINGS

A further understanding of the nature and advantages of various embodiments may be realized by reference to the remaining portions of the specification and the drawings.

Figure 1:
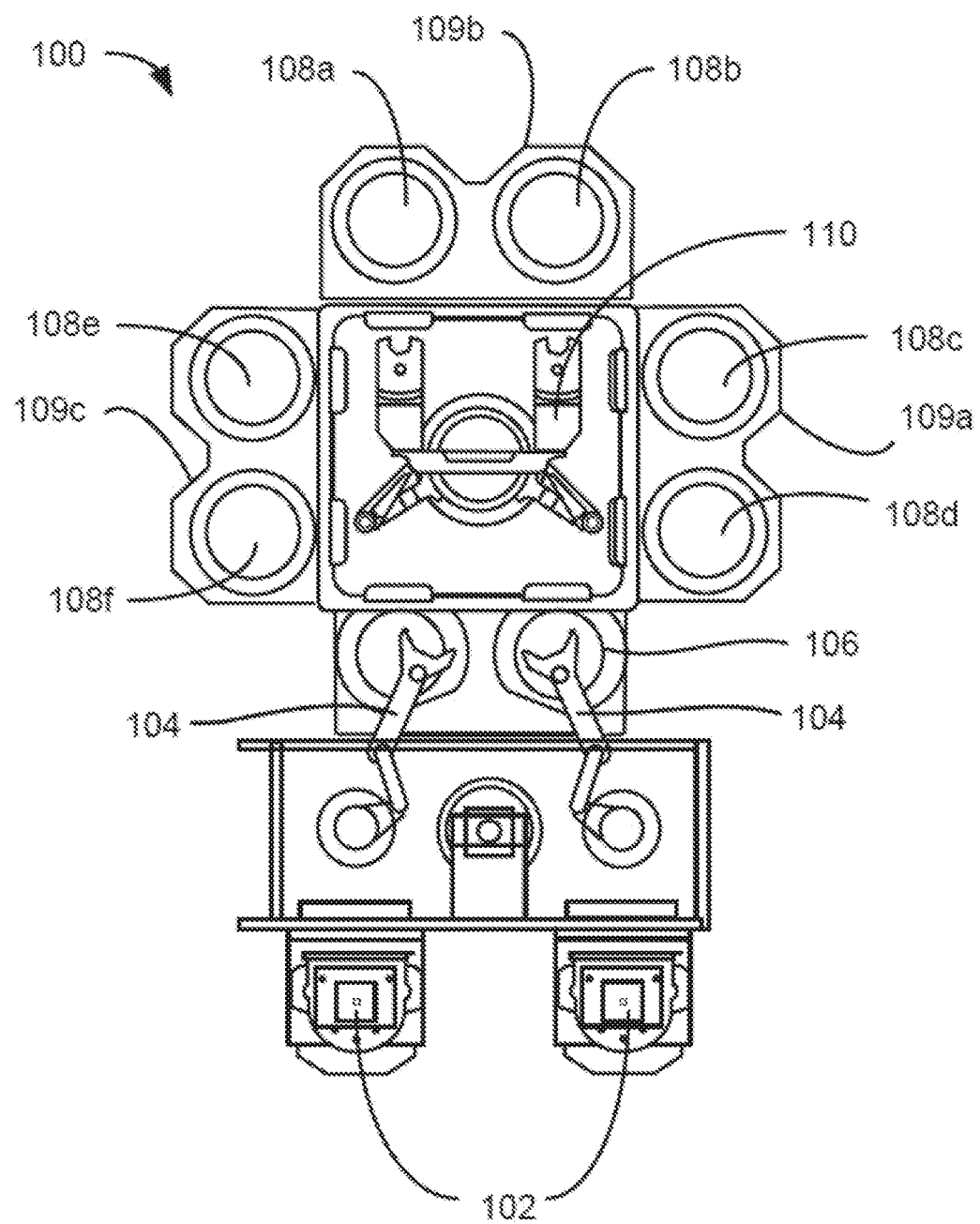
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. As device sizes continue to shrink, parasitic capacitance becomes a greater issue. Specifically, two types of capacitance in semiconductor devices are active capacitance and parasitic capacitance. Active capacitance generally relates to standard device performance. Parasitic capacitance tends to detrimentally affect device performance, and often occurs when conductive lines are separated by dielectric. For example, in some transistor structures, such as FinFET structures, the source and drain material may be separated from the gate in a lateral direction by a spacer material and a high-k material, and the gate may be separated from a substrate by the high-k material as well, acting as a dielectric barrier. The high-k material between the gate and the silicon substrate may permit additional miniaturization of device features without attendant increases in leakage currents due to tunneling. Unfortunately, this structure may cause a parasitic capacitance across the dielectric between the gate and the source and drain material. This capacitance may essentially slow device performance by causing delays, which reduces the frequency of the device, and also contributes to power consumption.

Parasitic capacitance depends on the dielectric constant of the intervening material as well as the spacing between source and drain and the gate. As device features shrink in size, less and less dielectric is positioned between the source and the drain relative to the gate, which may increase parasitic capacitance to the point that the dominant capacitance may be the outer fringe capacitance and the capacitance between the source/drain contact plug. High-k materials may include hafnium silicate, zirconium silicate, hafnium dioxide, or zirconium dioxide, among other materials, which may be characterized by a dielectric constant several times higher than silicon dioxide, depending on the oxide. For example, the dielectric constant of $HfO_2$ is 4-6 times higher than that of $SiO_2$. In this way, replacing silicon dioxide with a high-k material, in the interest of miniaturization, has the potential effect of introducing size-dependent parasitic capacitance.

In a replacement metal gate process, a high-k material occupies space in a metal oxide semiconductor structure. Similarly, a ferroelectric material, such as hafnium-zirconium oxide, occupies space in a negative capacitance field effect transistor. For a given contact pitch, the dimensions of the high-k material or the ferroelectric material may reduce the space available for the spacer material, which, in turn, may increase the capacitance of the material between the source and drain contacts and the gate material. The increased capacitance may increase the parasitic resistance, and thus impair the performance of the transistor.

The present technology overcomes these issues with several adjustments to the process for removal and formation, and by utilizing an improved selective high-k deposition approach. Spacer layers according to the present technology may include a spacer material and a sacrificial material to which the high-k material exhibits selective non-binding properties. In addition, the sacrificial material may be sensitive to gentle etching processes, by which a fabrication process may remove the sacrificial material during airgap formation without affecting the remaining device features. By utilizing the sacrificial material formed according to the present technology, the high-k material may be selectively deposited on the silicon substrate and a consistent airgap may be produced to reduce parasitic capacitance. Selective deposition of the high-k material may in itself reduce parasitic capacitance by up to or about 20%, while combining selective deposition of the high-k material with the formation of an airgap may further reduce parasitic capacitance, such as up to or about 50% with respect to conventional gate-last processes.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
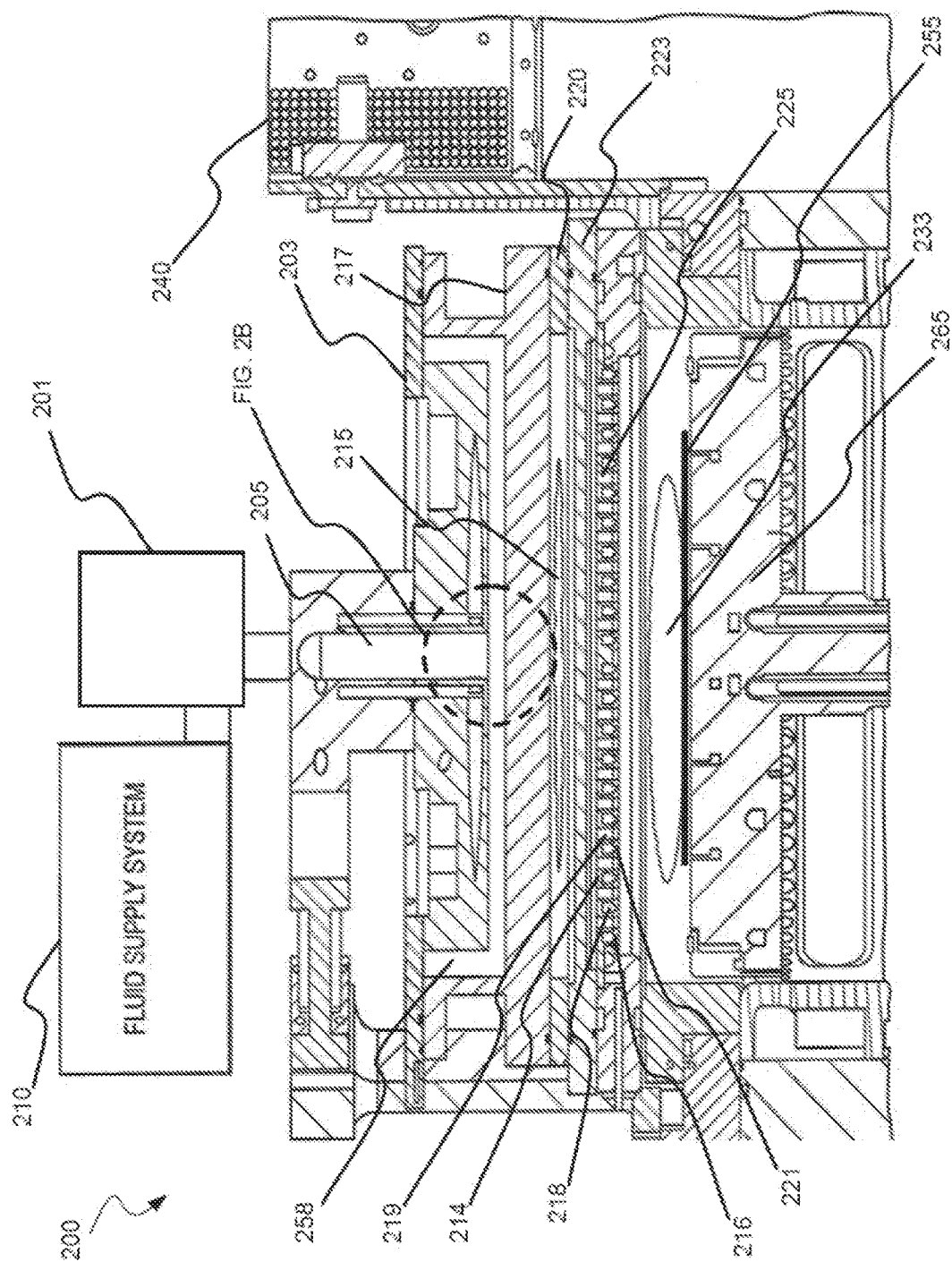
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
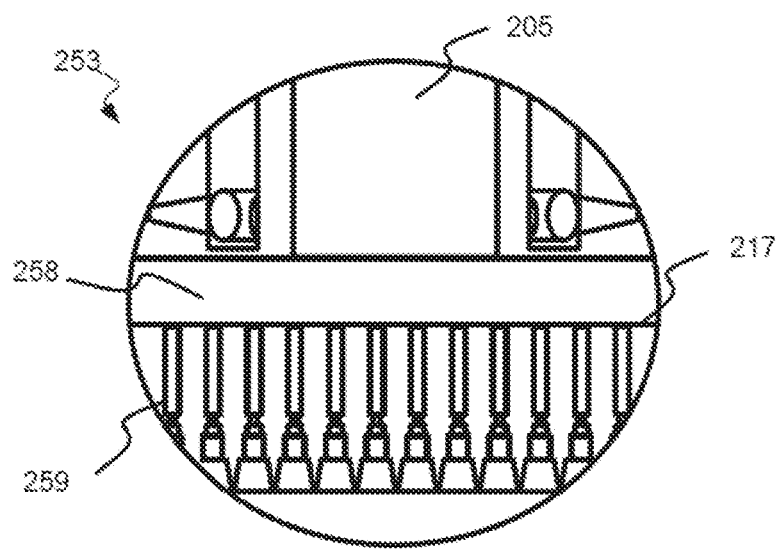
FIG. 2B shows a detailed view of an exemplary showerhead according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
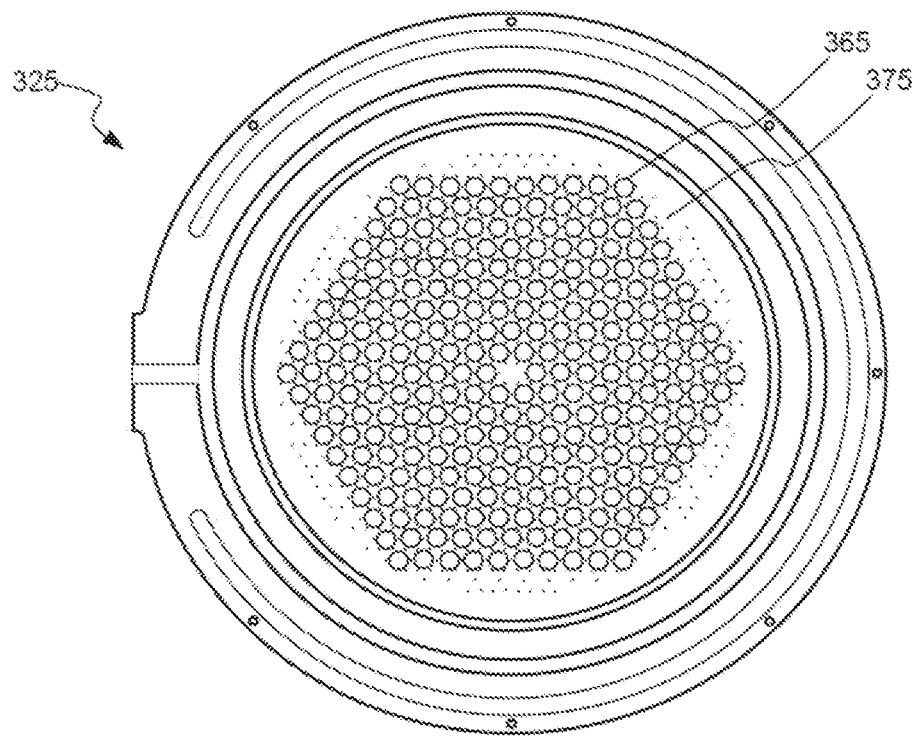
FIG. 3 shows a bottom plan view of an exemplary showerhead according to some embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

Figure 4:
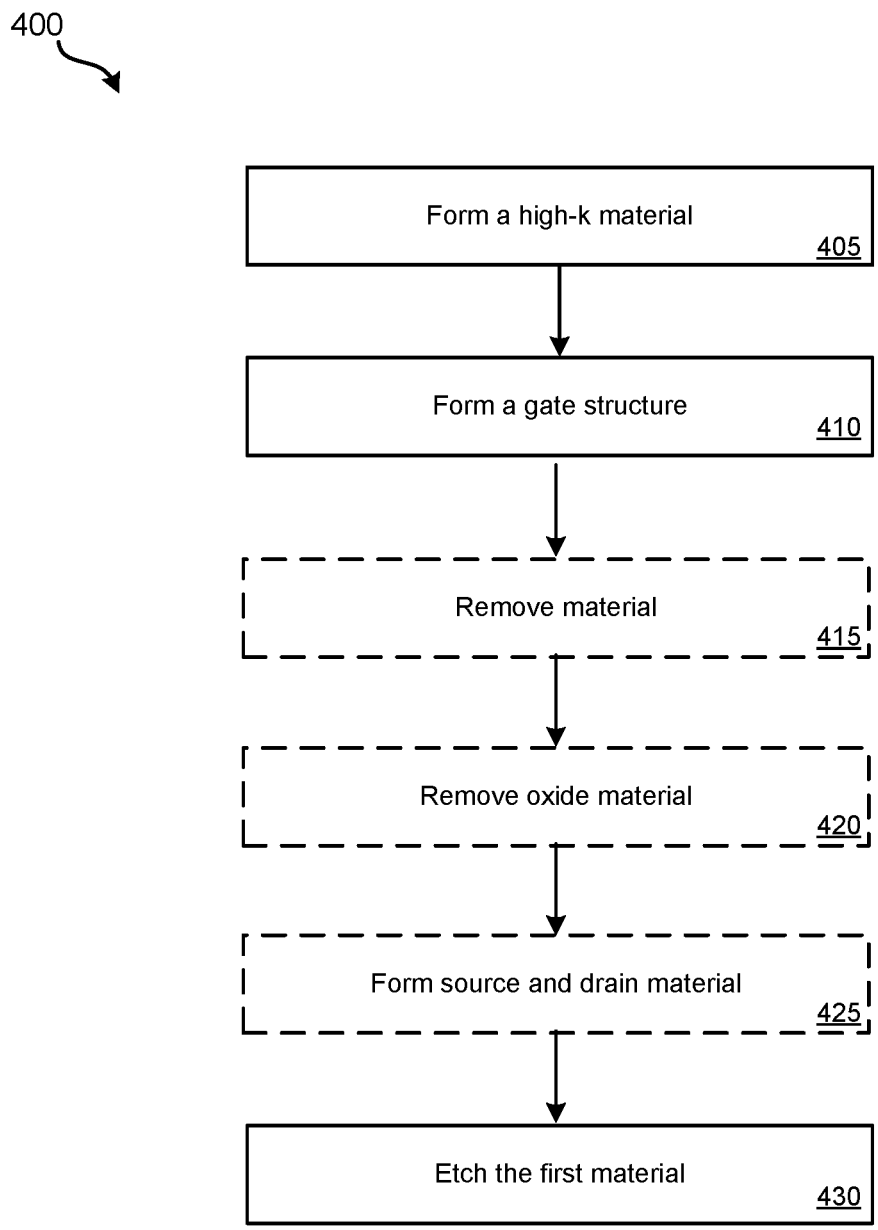
FIG. 4 shows selected operations in a method of forming an airgap in a semiconductor structure according to some embodiments of the present technology.

FIG. 4 shows selected operations in a method 400 of forming an airgap in a semiconductor structure according to some embodiments of the present technology. Many operations of method 400 may be performed, for example, in the chamber 200 as previously described. Method 400 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 400 describes operations shown schematically in FIG. 5, the illustrations of which will be described in conjunction with the operations of method 400. It is to be understood that FIG. 5 illustrates only partial schematic views, and a substrate may contain any number of transistor sections having aspects as illustrated in the figures, as well as alternative structural aspects that may still benefit from aspects of the present technology.

Method 400 may involve optional operations to develop the semiconductor structure to a particular fabrication operation. As illustrated in FIG. 5, the semiconductor structure may represent a device after a dummy gate material has been etched to form a trench between two sidewalls. In reference to method 400, one or more optional operations, such as preparation of the dummy gate material, are described in more detail in reference to FIG. 6, below.

Figure 5A:
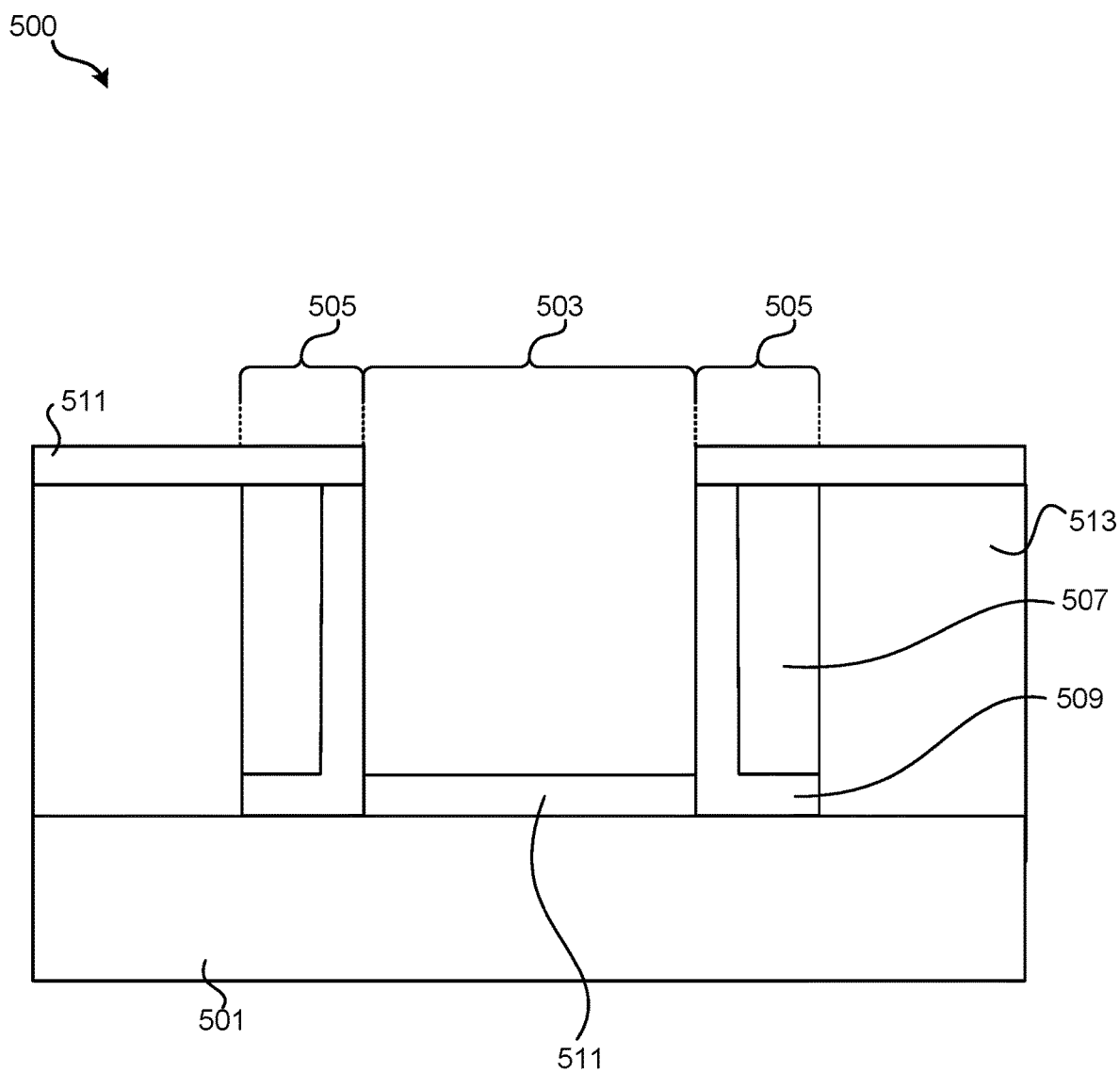
FIGS. 5A-5F illustrate schematic cross-sectional views of substrate materials on which selected operations are being performed according to some embodiments of the present technology.

As illustrated in FIG. 5A, structure 500 may include a substrate 501 made of or containing silicon or some other semiconductor substrate material, on which a trench 503 has been formed across the substrate 501. Structure 500 may be configured to have a number of transistor structures formed overlaying the substrate 501, when completed. For example, the trench 503 may be sized to receive gate material to produce a metal gate, described in more detail in reference to FIG. 5B. The trench 503 may be bounded on either side by sidewalls 505, which may include one or more materials including, but not limited to, a spacer material 507 and a first material 509 that may be a sacrificial material.

The spacer material 507 may be an insulative material, and may include any of oxygen, nitrogen, and/or carbon in embodiments. Exemplary materials may be or include silicon oxide, silicon nitride, silicon oxycarbide, silicon oxynitride, silicon carbonitride, silicon oxycarbonitride, or may be a metal-containing material including any of the oxygen, nitrogen, and/or carbon concentrations including, and may include, for example, aluminum, magnesium, titanium, tantalum, or any other metal and transition metal species, as well as other metalloid materials.

The first material 509 may be a material selected in part for displaying a molecular structure with a limited number of dangling surface bonds. Exemplary materials may be or include hexagonal boron-nitride (h-BN), molybdenum disulfide ($MoS_2$), tungsten selenide ($WSe_2$), tungsten disulphide ($WS_2$), graphene, black phosphorous, or any other material displaying a planar molecular structure characterized by predominant in-plane covalent bonding and negligible or limited out-of-plane bonding. In some embodiments, the first material 509 may be or include a sacrificial material, such as graphene, as described in reference to FIG. 5F, below.

The selection of the first material 509 for inclusion in structure 500 may be guided at least in part by a relatively weak interaction with a high-k material 511 or a ferroelectric material. In some embodiments, the ferroelectric material may be or include $PbZr/TiO_3$ (PZT), $BaTiO_3$, or $PbTiO_3$, hafnium-zirconium oxide (HZO), although the ferroelectric material is not limited to these materials, and may be or include any ferroelectric material that is compatible with semiconductor fabrication processes such as deposition and etch and that is suitable for incorporation into structure 500.

At operation 405, the high-k material 511 may be formed overlaying the substrate 501 at a floor of the trench 503, such as between the sidewalls 505. Additionally, the high-k material 505 may be formed on the floor of the trench 503 selectively, such that the first material 509 is substantially free of the high-k material 511 along surfaces having limited dangling bonds, such as the sidewalls of trench 503. As mentioned above, the high-k material 511 may be or include hafnium silicate, zirconium silicate, hafnium dioxide, or zirconium dioxide, which may be characterized by a dielectric constant several times higher than silicon dioxide, depending on the oxide. The deposition or formation may be performed in any of a variety of ways of performing a conformal coating on the exposed structures to a thickness of less than or about a few nanometers or more. For example, the deposition may utilize or include CVD, PECVD, PVD, ALD, electron beam deposition, or any other method of deposition. As a result of the selective deposition or formation of the high-k material, structure 500 may include one or more layers of high-k material 511 overlying disparate regions of structure 500 as a non-conformal coating. For example, high-k material 511 may also be formed on the floor of the trench 503 and on an upper lateral surface of the sidewalls 505 relative to a lateral planar surface of the substrate 501, and an oxide material 513 that is formed as part of preparatory operations preceding the formation of the trench, described in more detail in reference to FIG. 6, below. The oxide material 513 may be or include any material typically employed to form an inter-layer dielectric layer, including, but not limited to, low-k dielectric materials such as silica, organosilicate glass, or other dielectric materials, which may be formed by blanket deposition or other deposition techniques.

In some embodiments, an interfacial layer may be maintained between the substrate 501 and the high-k material 511. The interfacial layer can be or include silicon dioxide and can be formed in one or more ways including, but not limited to, annealing the substrate 501 prior to forming the high-k material 511. Advantageously, an interfacial oxide layer may improve performance of the semiconductor structure 500, for example, by improving the overall electrical quality of the interface between the substrate 501 and the high-k material 511 and/or improving the quality of the high-k material 511 layer formed in operation 435 by acting as a nucleation layer for deposition techniques such as atomic layer deposition. In some embodiments, an interfacial layer may lessen mobility degradation due to remote scattering, at least in part by spacing the substrate 501 from the high-k material 511.

Figure 5B:
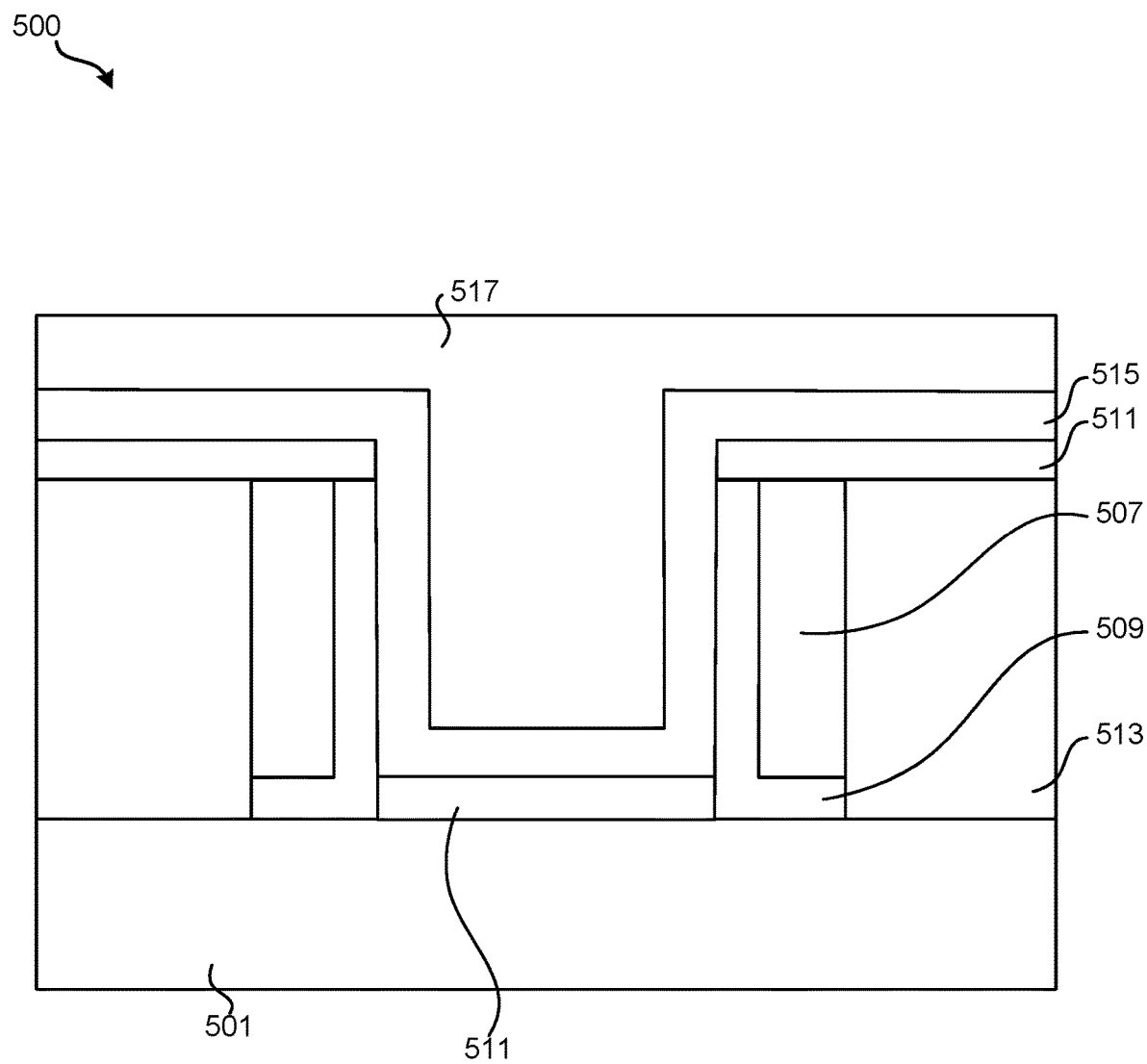
Figure 5C:
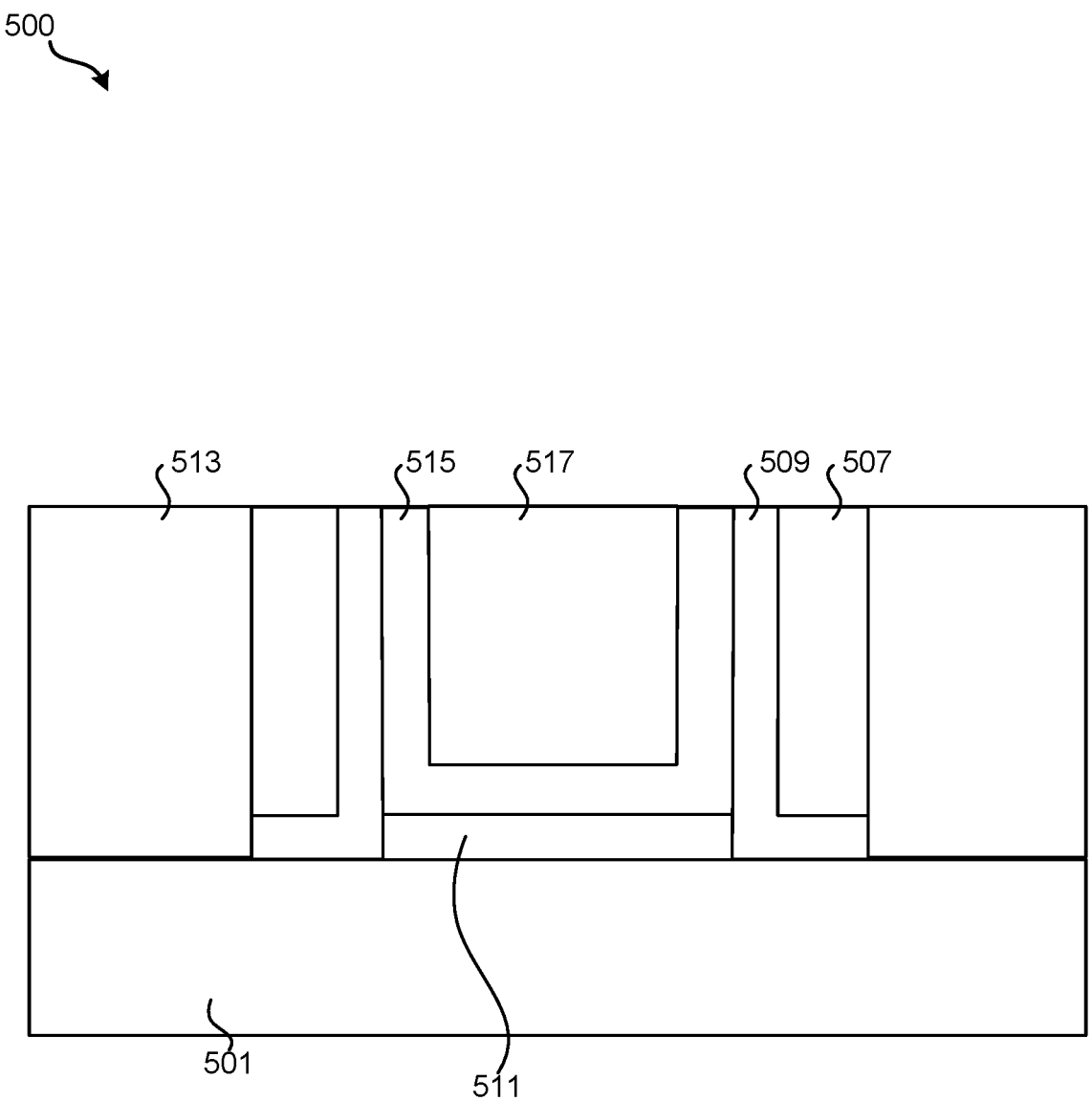

At operation 410, a gate structure may be formed on the high-k material 511, as described in reference to FIG. 5B and FIG. 5C. In some embodiments, as illustrated in FIG. 5B, one or more gate materials may be formed on the substrate 501. For example, a work function ("WF") material 515 may be formed by deposition of a conformal coating, or other techniques, on the high-k material 511 and the first material 509. In some embodiments, to avoid interactions between the high-k material 511 and polysilicon that may inhibit performance of the gate structure, the WF material 515 may be or include a metal. In some embodiments, the WF material 515 may be or include ruthenium, palladium, platinum, cobalt, or nickel, as well as metal oxides or metal nitrides, or other materials, any of which may include metals such as aluminum titanium, tantalum, or other metals in any combination together or with materials such as silicon, carbon, or other elements.

The gate structure may be formed according to a gate-last procedure, as described in more detail in reference to FIG. 6, below. Diffusion of atoms of the high-k material 511 into the WF material 515 may occur at lower temperatures relative to analogous processes in polysilicon gate structures, such as those using polysilicon gates formed during gate-first procedures. To avoid reactions between the atoms in the high-k material 511 and the WF material 515, a gate-last process may be used. Overlying the WF material 515, a fill metal 517 may be formed to provide a conductive electrode contact for the gate structure. The fill metal 517 may be or include aluminum, cobalt, tungsten, alloys thereof, or any other suitable metal or metal alloy.

Figure 5D:
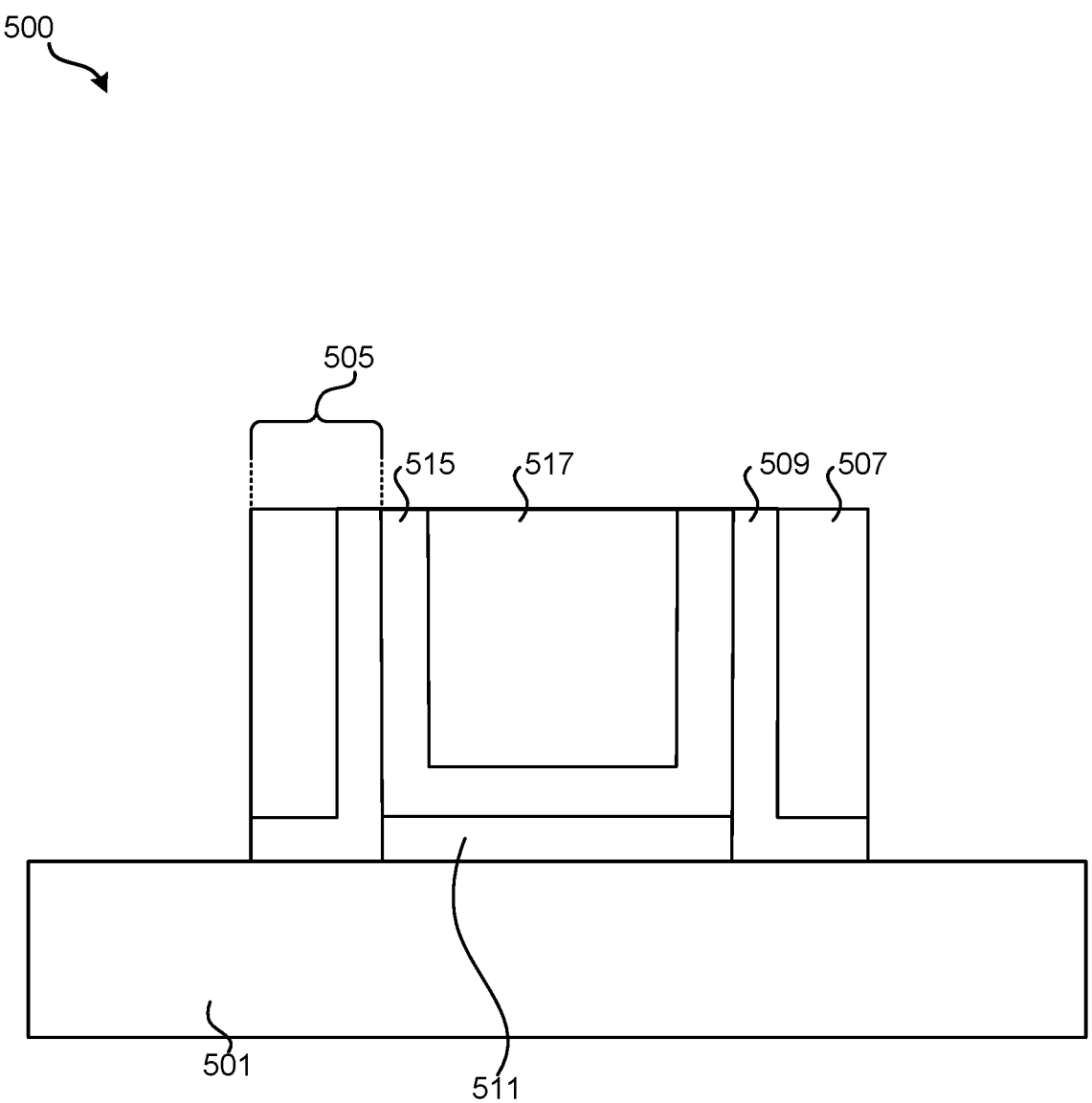
Figure 5E:
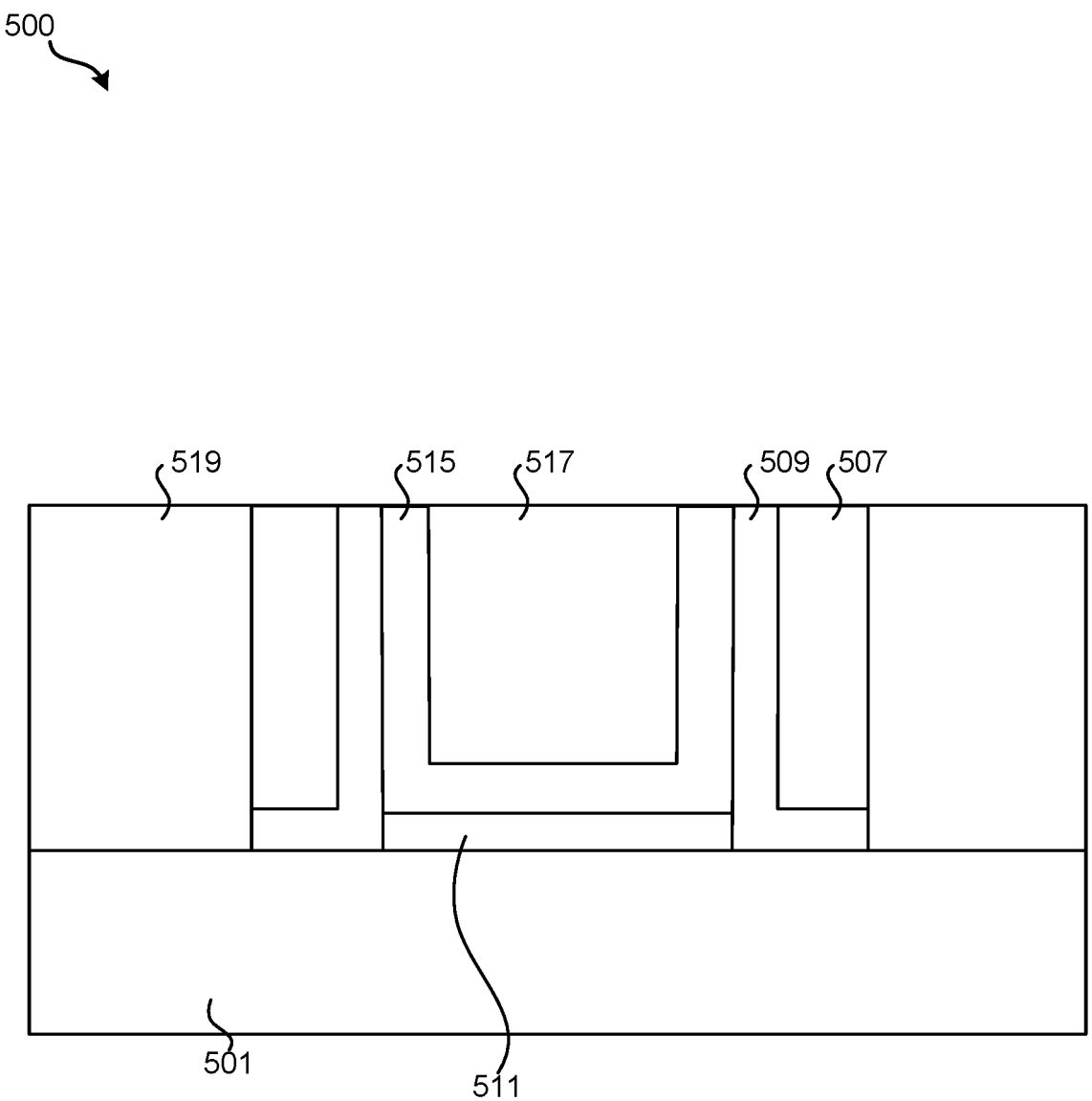

Forming a gate structure, as in operation 410, may include one or more additional operations, as illustrated in FIGS. 5C-5E. In some embodiments, operation 410 may include operation 415, whereby a portion of the WF material 515 and the fill metal 517 may be removed. The removal of the WF material 515 and the fill metal 517 may result in revealing an upper surface of the spacer material 507, the first material 509 and the oxide material 513, such that the upper surface of the structure 500 may be substantially free of high-k material 51, as shown in FIG. 5C. Operation 415 may include performing one or more removal techniques including, but not limited to, chemical mechanical polishing, planarization and etching, or other physical or chemical removal operations. As illustrated in the figures, by performing a selective deposition, the high-k material 511 may be laterally limited within the trench to a region directly between the gate materials and the underlying substrate. While many conventional technologies may also include high-k dielectric as a liner along sidewalls of the trench, which may lead to parasitic capacitance as described above, the present technology may limit the high-k material within trench 503 to a region along a floor of the trench, and the sidewalls may be substantially or essentially free of the high-k material. In some embodiments, the trench sidewalls may be completely free of high-k material where the WF material 511 may be in direct contact with first material 509 along the sidewalls of the trench above high-k material 511 on the floor of the trench.

Subsequent formation of the metal gate materials, a removal operation may be performed at operation 415 to expose structures of the semiconductor structure. For example, operation 420 may include removing the oxide material 513, for example, by selectively etching the oxide material 513 while retaining the sidewalls 505 of the trench as illustrated in FIG. 5D. The removal operation 420 may be performed in chamber 200 previously described, which may allow an oxide-selective etch to be performed The process may be performed using a dry etch process utilizing a plasma or remote plasma, which may produce plasma effluents of a halogen-containing precursor, such as, for example, a fluorine-containing precursor, or a chlorine-containing precursor. The process may also utilize a hydrogen-containing precursor in some embodiments, which may also be included in the remote plasma or may bypass the remote plasma to interact with radical halogen-containing plasma effluents in the processing region.

The process may be performed below about 10 Torr in embodiments, and may be performed below or about 5 Torr in embodiments. The process may also be performed at a temperature below about 100° C. in embodiments, and may be performed below about 50° C. As performed in chamber 200, or a variation on this chamber, or in a different chamber capable of performing similar operations, the process may anisotropically remove the oxide layer 513. In embodiments, the process may have a selectivity relative to the spacer material 507 and the first material 509 greater than or about 100:1, and may have a selectivity greater than or about 200:1, greater than or about 300:1, greater than or about 400:1, or greater than or about 500:1 in embodiments. Because of this selectivity, and because the formed material may be only a few nanometers in thickness as previously noted, all other exposed materials may be substantially or essentially maintained during this removal operation.

At operation 425, the volume previously occupied by the oxide material 513 may be filled by a source and drain material 519. In some embodiments, the source and drain material 519 may be or include silicon or silicon germanium structures, among other doped or formed materials, which may later form the source and drain across the gate structure. The source and drain material 519 may be formed by epitaxial growth in some embodiments. When epitaxial growth is performed to form source/drain materials 519, as one exemplary formation method, the growth may occur on any exposed silicon containing materials, such as the substrate 501 and the spacer material 507.

Figure 5F:
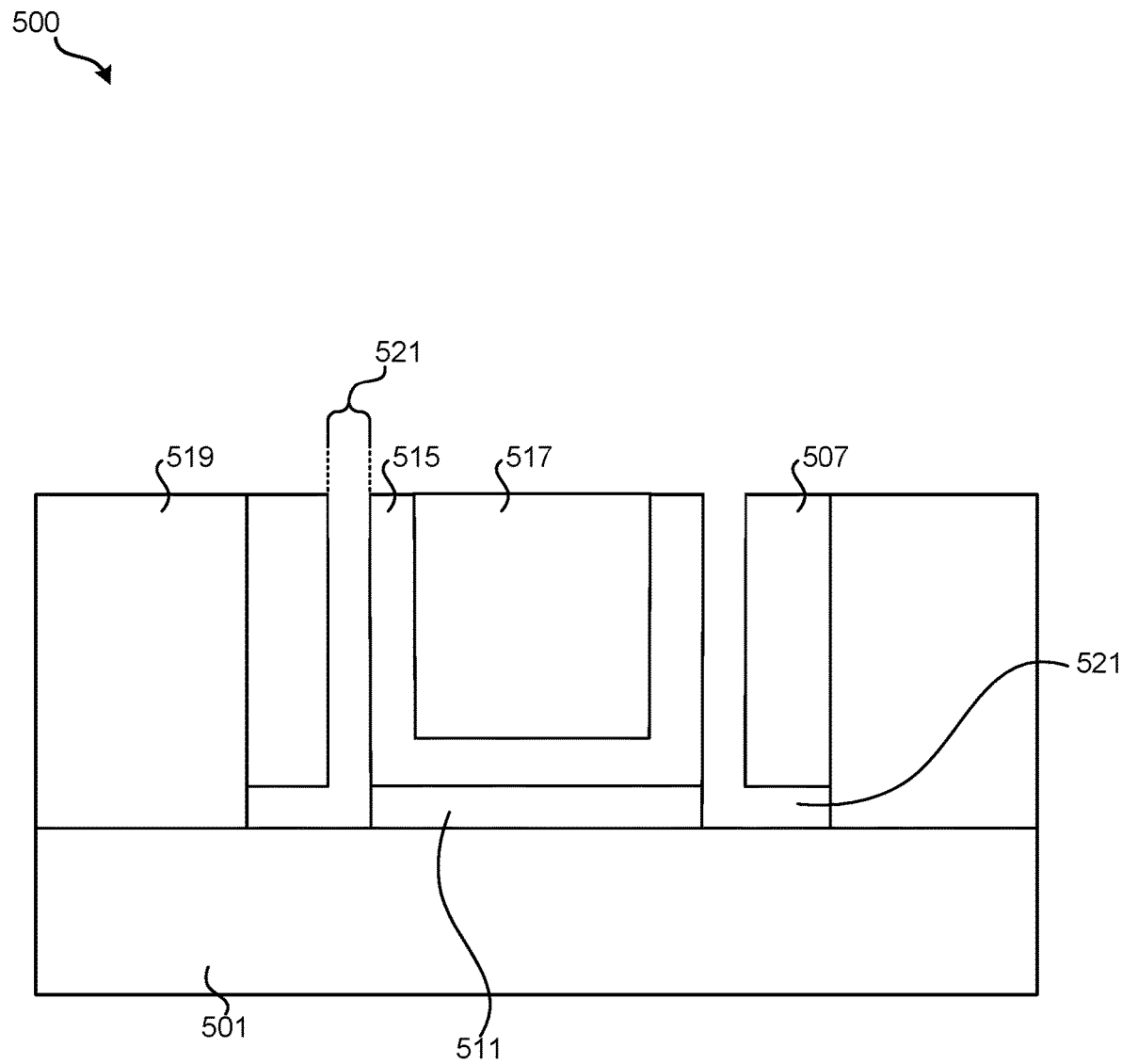

Subsequent formation of the source and drain material 519, operation 430 may include a carbon-selective etch or an etch selective towards carbon-containing films, for example, which may remove the first material 507 with a selectivity relative to the spacer material 507, the high-k material 511, and the WF material 515. In some embodiments, operation 430 may include a reactive oxygen plasma generated to selectively remove the first material 509 without impacting, or with a minimal impact on, any of the other materials on the substrate 501. For example, in embodiments where the first material 509 may be or include graphene or one or more other carbon allotropes, exposure to an oxygen plasma may selectively remove the graphene from between the gate structure and the spacer material 507, thereby leaving an airgap 521 in the volume once occupied by the graphene, as illustrated in FIG. 5F. As illustrated in FIG. 5F, the airgap 521 may extend between the spacer material 507 and the substrate 501, for example as an undercut beneath the spacer material 507, such that the airgap 521 may extend between the source and gate material 519, and between the gate structure and the high-k material 511. As a result of forming the airgap 521 by removing one or more graphene layers, a width of the airgap 521 may correspond to a characteristic dimension. The dimension may be any number of feature characteristics, such as a distance between the WF material 515 and the spacer material 507, and which may be equivalent to a multiple of the layer thickness of multi-layer graphene. In some embodiments, the distance between the WF material 515 and the spacer material 507 spanned by the airgap 521 may be less than or about 10 nm, and may be less than or about 5 nm, less than or about 3 nm, less than or about 1 nm, or less.

Advantageously, forming the airgap 521 as described above may reduce the parasitic capacitance exhibited by the structure 500, especially when the characteristic dimensions of the structure 500 decrease in line with industry improvements in miniaturization. For example, forming the airgap 521 with a width of approximately 1.5 nm in place of a high-k material 515 between the gate metal and the spacer material 507 may provide an approximate reduction in an equivalent parasitic capacitance between the gate structure and the source and drain material 519 of greater than or about 10%, and may provide a reduction in parasitic capacitance relative to conventional structures of greater than or about 20%, greater than or about 30%, greater than or about 40%, greater than or about 50%, greater than or about 60%, or higher, depending on the feature pitch of the structure.

In some embodiments, the method 400 may exclude operation 430, such that the structure 500 may include the first material 509, rather than removing it in a selective etch process. For example, the first material 509 can be or include hexagonal boron nitride (h-BN), and the method 400 may retain the h-BN layer after forming the source and drain material 519, leaving a structure as illustrated in FIG. 5E. For example, following formation of the gate structure, the first material 509 may extend vertically along exterior edges of the high-k material 511 material and the gate structure. In such cases, the h-BN may act as a second spacer layer between the gate structure and the source and drain material 519. In some embodiments, for a layer thickness of approximately 1.5 nm, employing the first material 509 as a second spacer layer may provide a reduction of effective capacitance between the gate structure and the source and drain material 519 of greater than or about 20% relative to a layer of high-k material 511 of equivalent thickness.

Figure 6:
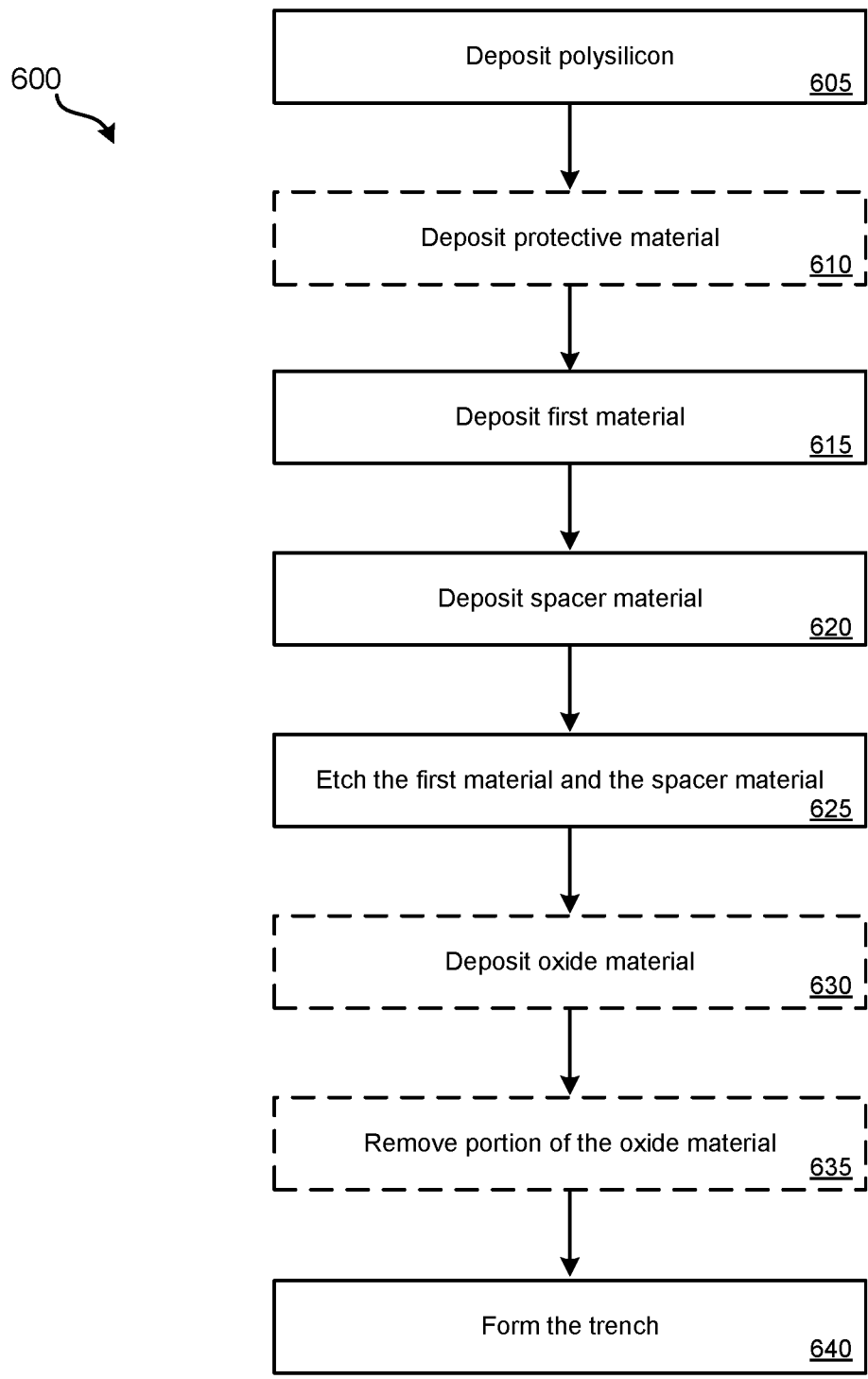
FIG. 6 shows selected operations in a method of forming a trench in a semiconductor structure according to some embodiments of the present technology.
Figure 7:
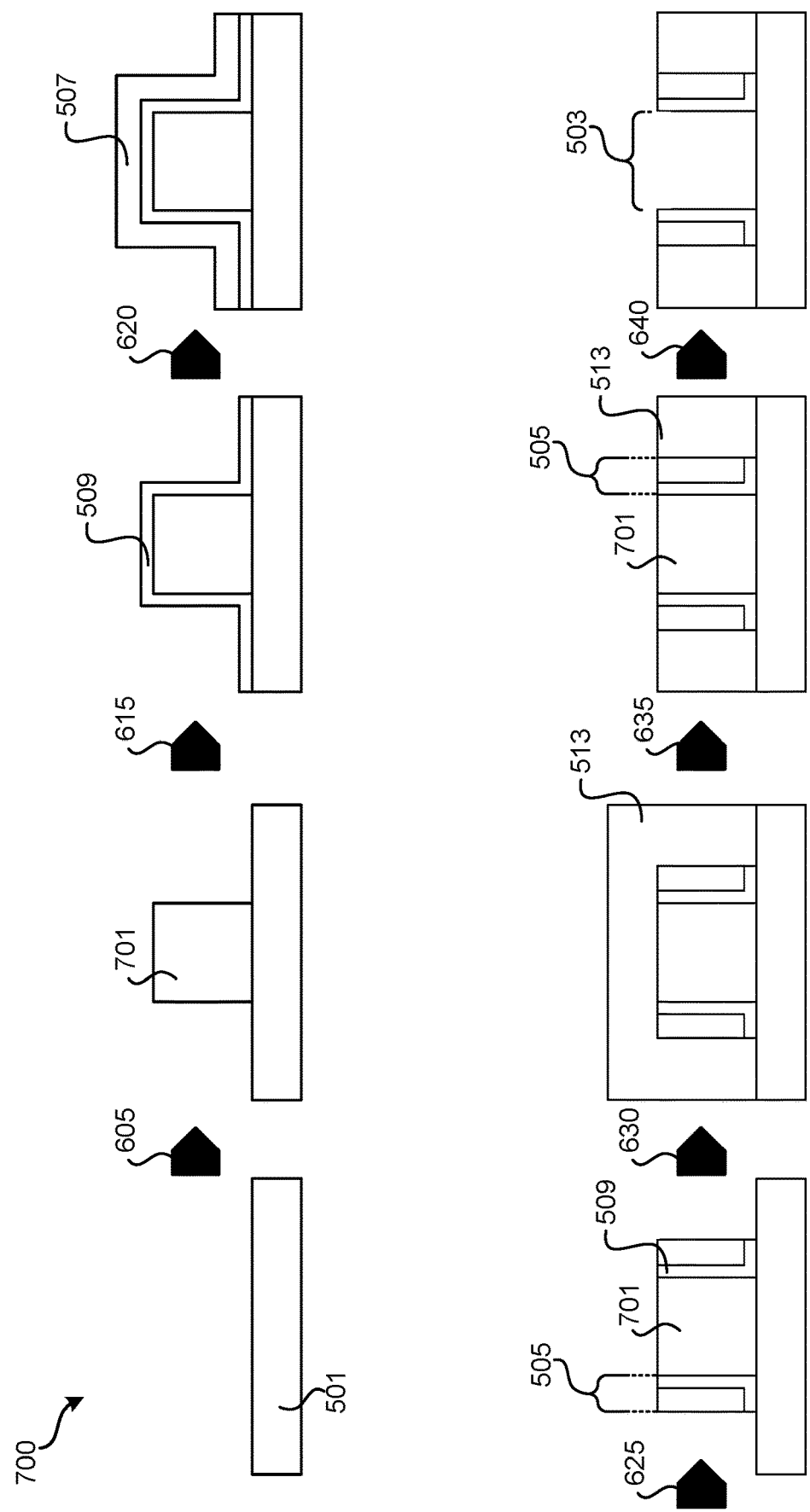
FIG. 7 illustrates schematic cross-sectional views of substrate materials on which selected operations are being performed according to some embodiments of the present technology.

FIG. 6 shows selected operations in a method 600 of forming a trench in a semiconductor structure according to some embodiments of the present technology. As described above in reference to FIG. 4, many operations of method 600 may be performed, for example, in the chamber 200 as previously described and may include one or more operations prior to the initiation of the method. Furthermore, method 600 may include one or more optional operations that may be included in the process discussed previously for method 400, or any other process described previously. Method 600 describes operations shown schematically in FIG. 7, the illustrations of which will be described in conjunction with the operations of method 600. It is to be understood that FIG. 7 illustrate only partial schematic views, and a substrate may contain any number of transistor sections having aspects as illustrated in the figures, as well as alternative structural aspects that may still benefit from aspects of the present technology.

In accordance with one or more processes of a gate-last formation process, method 600 may include operation 605, by which polysilicon 701, or some other dummy or sacrificial material, may be formed on the substrate 501. Subsequent formation of the polysilicon 701, method 600 may optionally include operation 610, by which a protective material may be deposited on the surface of the polysilicon 701. The protective material may be or include a dielectric material, and may shield the subsequently deposited layers from etch reactants employed in removal of the polysilicon 701. Subsequently, method 600 may include operation 615, which may include forming the first material 509 as a layer overlying the substrate 501 and the polysilicon 701. Subsequent formation of the first material 509, the method 600 may include operation 620, by which a layer of spacer material 507 may be deposited overlying the first material 509. In this way, the substrate 501 may include a conformal coating of first material 509 between the substrate 501 and a conformal layer of spacer material 507.

Subsequent formation of the spacer material 507 layer, operation 625 may include etching a portion of the first material 509 and the spacer material 507 to form the sidewalls 505. As a result of the operations 615 and 620, the sidewalls may define a ledge on which the spacer material is formed laterally outward from the gate structure. As described in reference to FIG. 5F, above, the ledge formed by the first material 507 may afford an airgap, such as airgap 521 of FIG. 5F described above, having a portion of the airgap extending from the source and drain material 519 to the high-k material 511. Subsequent operation 625, whereby the sidewalls 505 are formed and the polysilicon 701 revealed, operation 630 may include forming a layer including the oxide material 513. Subsequent operation 630, operation 635 may include removing a portion of the oxide material 513 to reveal an upper surface of the sidewalls 505 and the polysilicon 701. In some embodiments, the method 600 may include operation 640, by which the polysilicon 701 may be removed, thereby forming the trench 503 between the sidewalls 505, such that lateral faces of the first material 509 are revealed, forming the inner faces of the trench 503. Operation 640 may include a wet chemical etch or other removal process that may be selective for polysilicon, including, for example, an HF etch process. Once the dummy material has been removed, operations to form a high-k material as described previously may be performed. By producing structures according to some embodiments of the present technology, gate and high-k materials may be maintained separated from the source/drain materials by an airgap, which may facilitate a reduction in parasitic capacitance lost laterally from these structures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of forming an airgap in a semiconductor structure, the method comprising:
    forming a high-k material on a floor of a trench, wherein the trench is defined on a semiconductor substrate between sidewalls of a first material and a spacer material;
    forming a gate structure on the high-k material wherein the gate structure contacts the first material along each sidewall of the trench;
    forming a source/drain material next to the spacer material; and etching the first material, wherein the etching forms an airgap adjacent the gate structure and underneath the spacer material from the high-k material to a sidewall of the source/drain material.

2. The method of forming an airgap of claim 1, wherein the first material defines a ledge on which the spacer material is formed laterally outward from the gate structure.

3. The method of forming an airgap of claim 1, wherein the high-k material is separated from the spacer material by the airgap.

4. The method of forming an airgap of claim 1, wherein the sidewalls of the trench are maintained substantially free of the high-k material while forming the high-k material.

5. The method of forming an airgap of claim 1, wherein the first material comprises graphene.

6. The method of forming an airgap of claim 1, further comprising:
  depositing polysilicon on the semiconductor substrate, the polysilicon having a defined width equivalent to a width of the trench;
  depositing the first material overlying the polysilicon and the semiconductor substrate;
  depositing the spacer material overlying the first material;
  etching the first material and the spacer material to reveal the polysilicon and define the sidewalls; and
  forming the trench at least in part by removing the polysilicon.

7. The method of forming an airgap of claim 6, further comprising:
  depositing a protective material on the polysilicon before depositing the first material.

8. The method of forming an airgap of claim 1, wherein the first material comprises hexagonal boron nitride.

9. A method of forming a semiconductor structure, the method comprising:
  depositing a dielectric material on a floor of a trench, wherein the trench is defined on a silicon substrate between sidewalls of a first material and a spacer material; and
  forming a gate structure on the dielectric material, between the sidewalls, wherein the gate structure is in contact with the first material at the sidewalls of the trench, and wherein the first material comprises graphene or hexagonal boron nitride.

10. The method of forming a semiconductor structure of claim 9, wherein the first material defines a ledge on which the spacer material is formed laterally outward from the gate structure.

11. The method of forming a semiconductor structure of claim 9, wherein the first material extends vertically along exterior edges of the dielectric material and the gate structure.

12. The method of forming a semiconductor structure of claim 9, wherein the sidewalls of the trench are maintained substantially free of the dielectric material while forming the dielectric material.

13. The method of forming a semiconductor structure of claim 8, wherein the gate structure comprises a work-function material and a fill metal, and wherein the forming the gate structure comprises:
  depositing the work-function material adjacent the sidewalls and overlying the dielectric material;
  depositing the fill metal on the work-function material; and
  removing the fill metal, the work-function material, and a portion of the dielectric material to reveal the spacer material.

14. The method of forming a semiconductor structure of claim 8, wherein the dielectric material is a high-k material or a ferroelectric oxide material.

15. A semiconductor structure comprising:
  a trench defined on a silicon substrate between sidewalls comprising a spacer material;
  a source/drain material;
  a dielectric material disposed on the silicon substrate; and
  a gate structure disposed on the dielectric material,
  wherein the dielectric material and the gate structure are each separated from the spacer material by an airgap that extends underneath the spacer material from the dielectric material to a sidewall of the source/drain material.

16. The semiconductor structure of claim 15, wherein the dielectric material is maintained between lateral edges of the gate structure.

17. The semiconductor structure of claim 15, wherein the airgap extends between the spacer material and the silicon substrate.

18. The semiconductor structure of claim 15, wherein the dielectric material is a high-k material or a ferroelectric oxide material.

19. The semiconductor structure of claim 15, further comprising an interfacial layer between the silicon substrate and the dielectric material, the interfacial layer comprising silicon oxide.

* * * * *